United States Patent
Mallikarjunaswamy et al.

(10) Patent No.: US 10,157,904 B2
(45) Date of Patent: Dec. 18, 2018

(54) HIGH SURGE BI-DIRECTIONAL TRANSIENT VOLTAGE SUPPRESSOR

(71) Applicant: Alpha and Omega Semiconductor (Cayman) Ltd., Grand Cayman (KY)

(72) Inventors: Shekar Mallikarjunaswamy, San Jose, CA (US); Ning Shi, San Jose, CA (US)

(73) Assignee: Alpha and Omega Semiconductor (Cayman) Ltd., Grand Cayman (KY)

( * ) Notice: Subject to any disclaimer, the term of this patent is extended or adjusted under 35 U.S.C. 154(b) by 0 days.

(21) Appl. No.: 15/476,735

(22) Filed: Mar. 31, 2017

(65) Prior Publication Data

US 2018/0286852 A1    Oct. 4, 2018

(51) Int. Cl.

| | |
|---|---|
| *H01L 21/70* | (2006.01) |
| *H01L 27/02* | (2006.01) |
| *H02H 9/04* | (2006.01) |
| *H02H 9/00* | (2006.01) |
| *H01L 29/08* | (2006.01) |
| *H01L 29/10* | (2006.01) |
| *H01L 29/06* | (2006.01) |
| *H01L 29/40* | (2006.01) |
| *H01L 29/732* | (2006.01) |

(52) U.S. Cl.
CPC ...... *H01L 27/0259* (2013.01); *H01L 29/0623* (2013.01); *H01L 29/0649* (2013.01); *H01L 29/0688* (2013.01); *H01L 29/0804* (2013.01); *H01L 29/0821* (2013.01); *H01L 29/1004* (2013.01); *H01L 29/1095* (2013.01); *H01L 29/404* (2013.01); *H01L 29/407* (2013.01); *H01L 29/732* (2013.01); *H02H 9/005* (2013.01); *H02H 9/046* (2013.01)

(58) Field of Classification Search
CPC ............ H01L 27/0259; H01L 29/0623; H01L 29/0649; H01L 29/0688; H01L 29/0804; H01L 29/0821; H01L 29/1004; H01L 29/1095; H01L 29/404; H01L 29/407; H01L 29/732

See application file for complete search history.

(56) References Cited

U.S. PATENT DOCUMENTS

| | | | |
|---|---|---|---|
| 7,538,997 B2 | 5/2009 | Mallikararjunaswamy | |
| 7,554,839 B2 | 6/2009 | Bobde | |
| 7,781,826 B2 | 8/2010 | Mallikararjunaswamy | |
| 7,795,987 B2 | 9/2010 | Bobde | |
| 7,863,995 B2 | 1/2011 | Ho | |

(Continued)

*Primary Examiner* — Victor A Mandala
*Assistant Examiner* — Colleen E Snow
(74) *Attorney, Agent, or Firm* — Innovation Counsel LLP

(57) ABSTRACT

A transient voltage suppressor (TVS) is constructed as an NPN bipolar transistor including individually optimized collector-base and emitter-base junctions both with avalanche mode breakdown. The TVS device is constructed using a base that includes a lightly doped base region bordered by a pair of more heavily doped base regions. The two more heavily doped base regions are used to form the collector-base junction and the emitter-base junction both as avalanche breakdown junctions. The lightly doped base region between the collector-base and emitter-base doping regions ensures low leakage current in the TVS device. In this manner, the TVS bipolar transistor of the present invention provides high surge protection with robust clamping while ensuring low leakage current.

20 Claims, 5 Drawing Sheets

(56) References Cited

U.S. PATENT DOCUMENTS

| | | | |
|---|---|---|---|
| 7,880,223 B2 | 2/2011 | Bobde | |
| 8,218,276 B2 | 7/2012 | Mallikarjunaswamy | |
| 8,338,854 B2 | 12/2012 | Bobde | |
| 8,338,915 B2 | 12/2012 | Mallikararjunaswamy | |
| 8,698,196 B2 * | 4/2014 | Guan | H01L 27/0255 257/173 |
| 2015/0364460 A1 * | 12/2015 | Huang | H01L 27/0255 257/106 |

* cited by examiner

HIGH SURGE BI-DIRECTIONAL TRANSIENT VOLTAGE SUPPRESSOR

BACKGROUND OF THE INVENTION

Voltages and current transients are major causes of integrated circuit failure in electronic systems. Transients are generated from a variety of sources both internal and external to the system. For instance, common sources of transients include normal switching operations of power supplies, AC line fluctuations, lightning surges, and electrostatic discharge (ESD).

Transient voltage suppressors (TVS) are commonly employed for protecting integrated circuits from damages due to the occurrences of transients or over-voltage conditions at the integrated circuit. Over-voltage protection are important for consumer devices or the Internet of Things devices as these electronic devices are exposed to frequent human handling and, as a result, may be susceptible to ESD or transient voltage events that may damage the devices.

In particular, the power supply pins and the data pins of the electronic devices both require protection from over-voltages conditions due to ESD events or switching and lightning transient events. Typically, the power supply pins needs high surge protection but can tolerate protection devices with higher capacitance. Meanwhile, the data pins, which may operate at high data speed, requires protection devices that provide surge protection with low capacitance as not to interfere with the data speed of the protected data pins.

Existing TVS protection circuits for high surge applications use vertical NPN or PNP bipolar transistor structures in open base configuration for bi-directional blocking. When a TVS is applied to protect the power line, it is important that the TVS has low leakage current. Leakage current through the TVS protection circuit may result in undesired power dissipation. Existing high surge TVS protection circuits decrease the leakage current by increasing the base doping level of the bipolar transistor. However, increased base doping decreases the gain of the bipolar transistor and compromises the clamping voltage.

BRIEF DESCRIPTION OF THE DRAWINGS

Various embodiments of the invention are disclosed in the following detailed description and the accompanying drawings.

DETAILED DESCRIPTION

Figure 1:
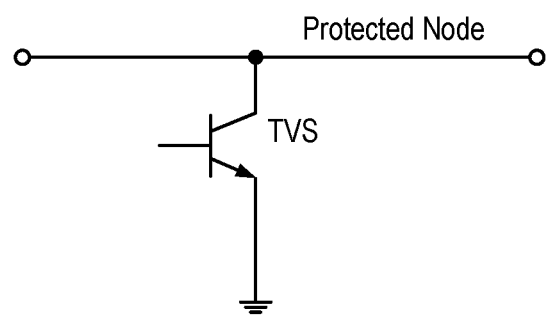
FIG. 1 is a circuit diagram of a TVS protection circuit constructed as an open base NPN bipolar transistor in some embodiments of the present invention.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a transient voltage suppressor (TVS) is constructed as an NPN bipolar transistor including individually optimized collector-base and emitter-base junctions both with avalanche mode breakdown without snap-back. The TVS of the present invention enables the base doping and the clamping voltage to be independently optimized to reduce leakage current while improve the clamping voltage characteristics. In this manner, the TVS of the present invention realizes bi-directional high surge protection with low leakage current and robust clamping voltage. Furthermore, the TVS of the present invention realizes a tunable breakdown voltage to enable the breakdown voltage to be optimized for the electronic device to be protected.

In conventional TVS devices for high surge protections, the base doping has to be increased in order to reduce the leakage current. But a heavily doped base region would compromise the clamping voltage. To the contrary, the TVS device of the present invention is constructed using a base that includes a lightly doped base region bordered by a pair of more heavily doped base regions. The two more heavily doped base regions are used to form the collector-base junction and the emitter-base junction both as avalanche breakdown junctions. Avalanche breakdown junctions are preferred for improved clamping voltage characteristics. Meanwhile, the lightly doped base region between the collector-base and emitter-base doping regions ensures low leakage current in the TVS device. In this manner, the TVS bipolar transistor of the present invention provides high surge protection with robust clamping while ensuring low leakage current.

In one embodiment, the electronic device to be protected has an operating voltage of 5V and the TVS is constructed to have a breakdown voltage of 6 to 7.5V. In other embodiments, the breakdown voltage of the TVS is tuned to accommodate the operating voltage values of the electronic device to be protected.

FIG. 1 is a circuit diagram of a TVS protection circuit constructed as an open-base NPN bipolar transistor in some embodiments of the present invention. In embodiments of the present invention, the TVS of the present invention provides system-level surge protection to electronic devices and is coupled to the power lines or power pins of the electronic device at the printed circuit board level or at the connector of the electronic device as the protected node. In one example, the TVS provides high surge protection in accordance with the International Electrotechnical Commission standard IEC 610004-5 which specifies high surge protection against a surge pulse of 8 us rise time and 20 us pulse width.

Figure 2:
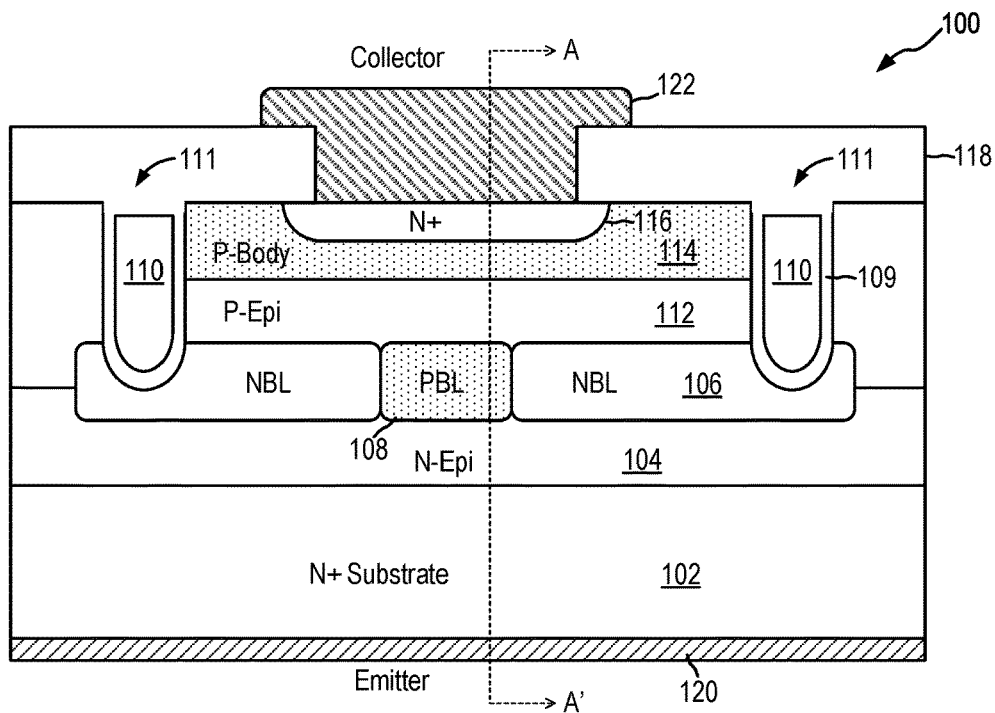
FIG. 2 is a cross-sectional view of a TVS device formed using an NPN bipolar transistor structure according to a first embodiment of the present invention.

FIG. 2 is a cross-sectional view of a TVS device formed using an NPN bipolar transistor structure according to a first embodiment of the present invention. Referring to FIG. 2, a TVS device 100 is formed on a heavily doped N+ substrate 102. A lightly doped N-epitaxial layer 104 is formed on the N+ substrate 102. An N-type buried layer (NBL) 106 and a P-type buried layer (PBL) 108 are formed on the N– epitaxial layer 104. The P-type buried layer 108 is formed in a central portion of the TVS device while the N-type buried layer 106 is formed around an outer perimeter of the P-type buried layer 108 as an isolation barrier. In some embodiment, the N-type buried layer 106 is formed using a heavy N-type dopant, such as Antimony (Sb) and the P-type buried layer 108 is formed using Boron (B). A lightly doped P-type epitaxial layer 112 is formed on the N-type epitaxial 104 and the N and P-type buried layers 106, 108. A P-body region 114 is formed in the P-type epitaxial layer 112, such as by using ion implantation and drive-in. The P-body region 114 is more heavily doped than the P-type epitaxial layer 112. A heavily doped N+ region 116 is formed in the P-body region 114 to complete the NPN bipolar transistor.

As thus formed, the TVS device 100 is constructed as an NPN bipolar transistor including an emitter formed by the N+ substrate 102, a base formed by the P-buried layer 108, the P-type epitaxial layer 112, and the P-body region 114, and a collector formed by the N+ region 116. A dielectric layer 118 is formed over the semiconductor structure to cover and protect the semiconductor device. An opening is formed in the dielectric layer 118 and a collector electrode 122 is formed in the opening for making an ohmic contact with the N+ region 116. An emitter electrode 120 for making electrical contact with the N+ substrate 102 is also formed on the backside of the substrate. The collector electrode 122 and the emitter electrode 120 are typically formed of conductive materials, such as metal layers.

In the present illustration, TVS device 100 is isolated by trench isolation structure 111 so that an array of identical TVS devices can be formed on the substrate or the TVS device can be formed with other devices to realize the desired protection circuit for the integrated circuit. In the present embodiment, a trench extending to the N-type buried layer 106 is formed to isolate TVS device 100 and the trench is lined with an oxide layer 109 and filled with a polysilicon layer 110. In other embodiments, an oxide filled trench isolation structure can be used. In FIG. 2, two trench isolation structures 111 are shown on either side of the TVS device. In actual implementation, the trench isolation structure 111 may be a single trench isolation structure encircling the central portion or the active area of the TVS device.

Figure 3:
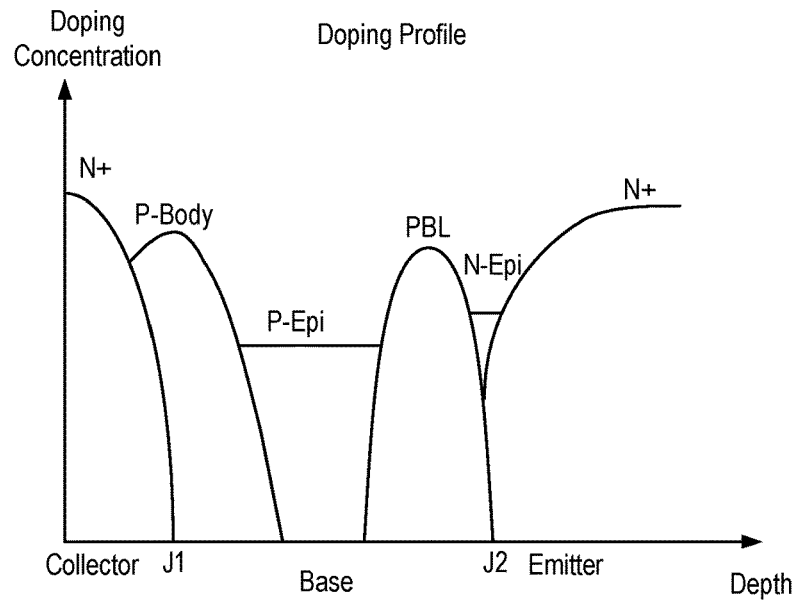
FIG. 3 illustrates a doping profile of the TVS device of FIG. 2 across the line A-A' in some examples of the present invention.

FIG. 3 illustrates a doping profile of the TVS device of FIG. 2 across the line A-A' in some examples of the present invention. Referring to FIG. 3, the TVS device 100, as thus constructed, includes a base that is formed by the lightly doped base region—P-type epitaxial layer 112—bordered by two more heavily doped base regions—the P-body region 114 and the P-buried layer 108. That is, the doped base regions 108, 114 are more heavily doped than the lightly doped base region 112. In some examples, the lightly doped base region 112 has a doping concentration of about $1 \times 10^{14}$ cm$^{-3}$ to $1 \times 10^{16}$ cm$^{-3}$, and the doped base regions 108, 114 has a doping concentration of about $2 \times 10^{16}$ cm$^{-3}$ to $1 \times 10^{18}$ cm$^{-3}$. As such, the base of the TVS device 100 includes two regions with high base doping separated by a low base doping region. The two more heavily doped base regions (P-body and PBL) separated by the lightly doped base region (P-Epi) ensure low leakage current for the TVS device 100. In particular, the low base doping region (P-Epi) provides a given amount of separation between the top more heavily doped base region (P-Body) and the bottom more heavily doped base region (PBL) in the TVS device. The base width of the TVS device can be varied by adjusting the doping level and/or the thickness of the low base doping region (P-Epi) to increase or decrease the distance between the two heavily doped base regions.

As thus constructed, the doping levels of the two more heavily doped base regions 108, 114 can be individually optimized or independently tailored to achieve the desired breakdown and blocking characteristics for the TVS device. The two doped base regions 108, 114 form two base junctions—a collector-base junction and an emitter-base junction—in the TVS device where the two base junctions are then individually optimized to obtain the desired breakdown and blocking characteristics. That is, the base doping region 108 (the P-buried layer) can have the same or a different doping level as the base doping region 114 (the P-body region). Because the doped base regions 108 and 114 used to form the emitter-base junction and the collector-base junction, respectively, have high base doping as compared to the background doping level of the P-type epitaxial layer 112, the collector-base junction and the emitter-base junction are both formed as avalanche junction so that the TVS device realizes bi-directional avalanche mode breakdown. Avalanche mode breakdown is preferred over punch-through mode breakdown for better breakdown and better clamping characteristics.

In one example, the breakdown voltage at both collector-base junction and emitter-base junction is selected to be 6.5V. In other examples, the breakdown voltages at the collector-base junction and emitter-base junction can be the same or different and can be individually optimized by selecting the desired base doping levels for the doped base regions 108 and 114. In some examples, the doped base region 108 has a doping concentration of about $1 \times 10^{19}$ cm$^{-3}$ and doped base region 114 has a doping concentration of about $3 \times 10^{17}$ cm$^{-3}$ to yield the 6.5V breakdown voltage.

In the TVS device 100 of FIG. 2, the breakdown voltage is determined by emitter-base junction—that is, the spacing between the N+ substrate 102 and the P-buried layer 108. The doping density of the N-buried layer 106 determines the injection efficiency. Meanwhile, the blocking voltage is determined by the collector-base junction—that is, the breakdown voltage of the N+ region 116 and the P-body region 114.

Figure 4:
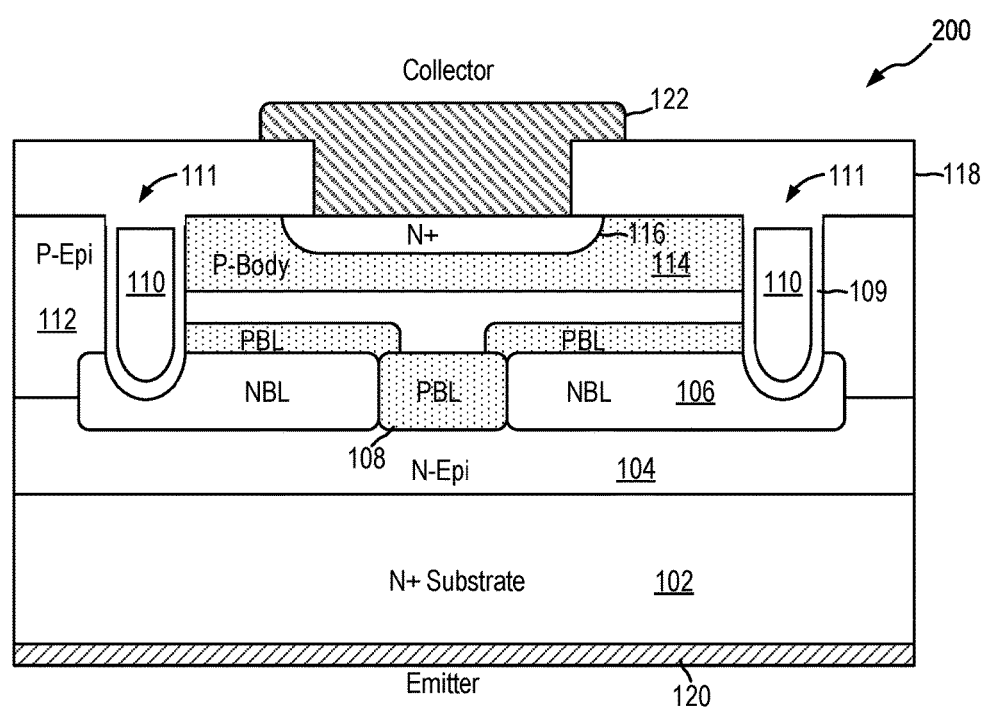
FIG. 4 is a cross-sectional view of a TVS device formed using an NPN bipolar transistor structure according to a second embodiment of the present invention.

FIG. 4 is a cross-sectional view of a TVS device formed using an NPN bipolar transistor structure according to a second embodiment of the present invention. Referring to FIG. 4, a TVS device 200 is constructed in the same manner as the TVS device 100 of FIG. 2 except for the formation of the P-type buried layer 108. In TVS device 200, the N-type buried layer 106 is formed with boron dopants as well to form a P-type buried layer above the N-type buried layer 106 for base charge control. The P-type buried layer 108 formed above and between the N-type buried layer 106 determines the injection efficiency and the snap-back characteristics of the TVS device 200.

Figure 5:
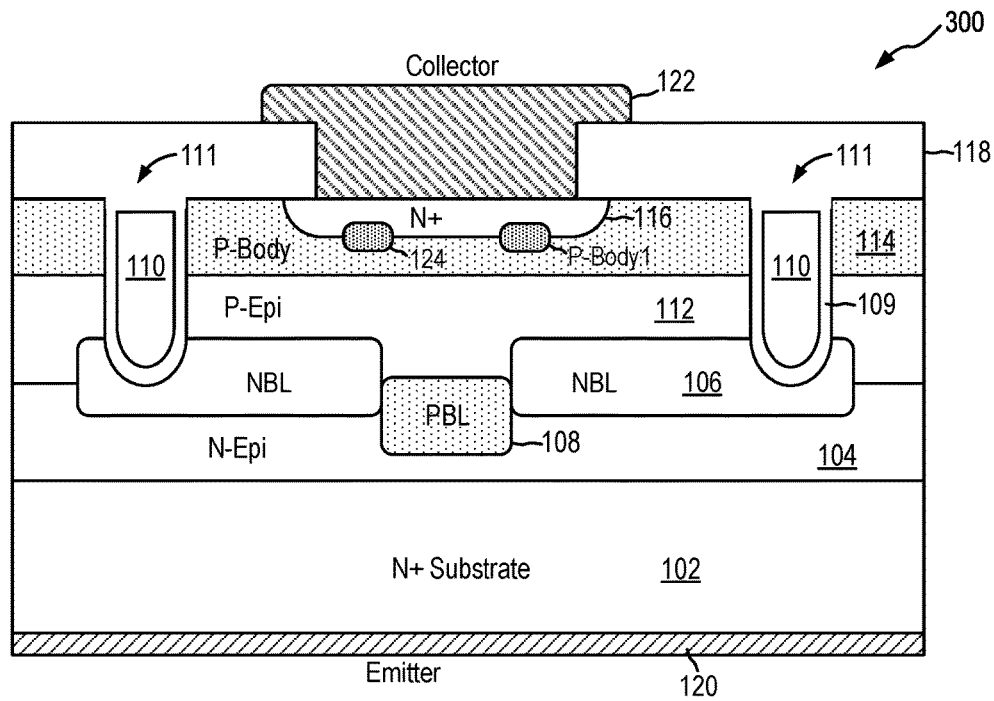
FIG. 5 is a cross-sectional view of a TVS device formed using an NPN bipolar transistor structure according to a third embodiment of the present invention.

FIG. 5 is a cross-sectional view of a TVS device formed using an NPN bipolar transistor structure according to a third embodiment of the present invention. Referring to FIG. 4, a TVS device 300 is constructed in a similar manner as the TVS device 100 of FIG. 2 except for the formation of the P-type buried layer and the P-body region. In the TVS device 300, the P-type buried layer 108 is formed deeper in the semiconductor structure than the N-type buried layer 106. In other words, the P-type buried layer 108 is formed at a deeper depth than the N-type buried layer 106. In one embodiment, the P-type buried layer 108 is formed using a higher implant energy implant than the implant energy used for the N-type buried layer 106. Accordingly, the heavily doped junction of the P-buried layer is formed at a deeper depth then the N-type buried layer 106. As thus formed, the P-buried layer 108 is closer to the N+ substrate 102 forming the emitter region of the TVS device. The breakdown of the transistor thus occurs closer to the N+ substrate 102.

Furthermore, in TVS device 300, a buried P-body junction is formed by one or more P-Body 1 regions 124 formed at the junction of the N+ region 116 and the P-body region 114. The P-body1 regions 124 are more heavily doped than the P-body region and are formed as islands of doped regions dispersed at the N+/P-body junction. In some embodiments, the P-body 1 regions 124 are arranged in a grid pattern at the N+/P-body junction. In some embodiments, the P-body1 regions 124 are formed by implantation of P-type dopants at the junction depth followed by annealing. The P-body1 regions 124 has the effect of pushing the breakdown of the collector-base junction to occur at the buried junction, instead of at the surface of the semiconductor structure. Breakdown that occurs at or near the surface of the semiconductor structure is often not well controller. However, breakdown that occurs at a buried junction, such as the N+ to P-body1 junction, can be better controlled and is thus more desirable.

More specifically, the P-body1 regions 124 are used to initiate the breakdown to force the breakdown to occur at the buried N+/P-body1 junction. The P-body1 regions 124 is formed in a grid pattern so that the injection efficiency is improved by the lightly doped P-body region 114 outside of the P-body1 grid pattern. That is, the P-body region 114 is more lightly doped than the P-body1 region 124 and the injection efficiency is improved at the buried junction formed by the more lightly doped P-body region 114 and the N+ region 116. Once breakdown is initiated, the N+ to P-body junction will sustain the breakdown action.

In the TVS device 300 of FIG. 5, the breakdown voltage is determined by emitter-base junction—that is, the spacing between the N+ substrate 102 and the P-buried layer 108. The doping density of the N-buried layer 106 determines the injection efficiency. Meanwhile, the blocking voltage is determined by the collector-base junction—that is, the breakdown voltage of the N+ region 116 and the P-body1 region 124.

Figure 6:
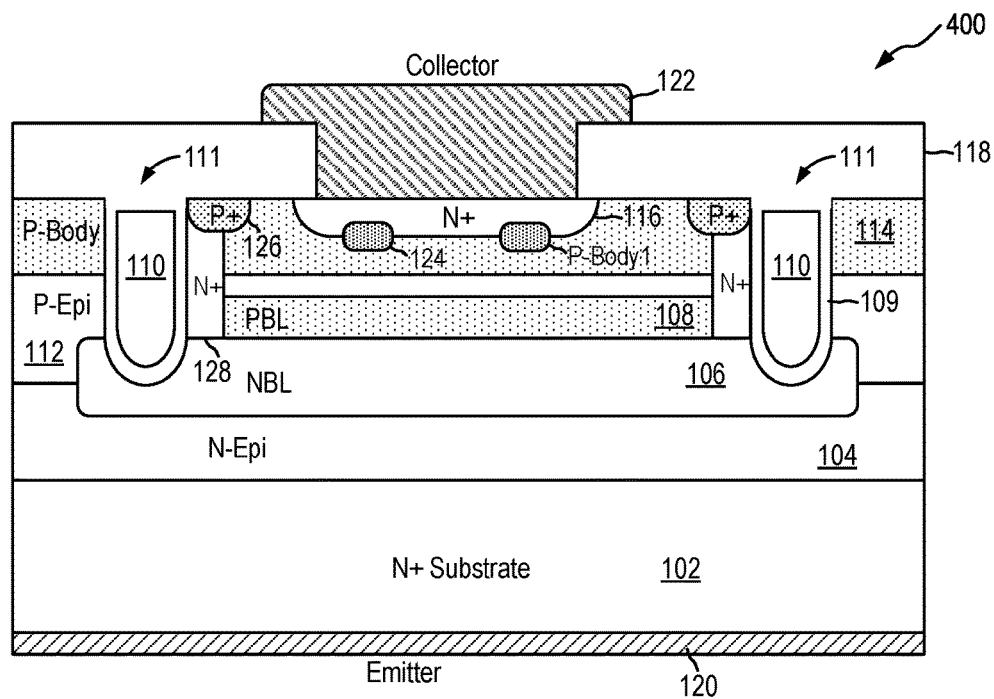
FIG. 6 is a cross-sectional view of a TVS device formed using an NPN bipolar transistor structure according to a fourth embodiment of the present invention.

FIG. 6 is a cross-sectional view of a TVS device formed using an NPN bipolar transistor structure according to a fourth embodiment of the present invention. Referring to FIG. 6, a TVS device 400 is constructed in a similar manner as the TVS device 300 of FIG. 5 except for the formation of the N-type buried layer and P-type buried layer and the use of N+ sinker regions. In the TVS device 400, the N-buried layer 106 is formed across the entire active area region between the trench isolation structures 111 and the P-buried layer 108 is formed in a central portion of the TVS device on top of the N-buried layer 106. As described above, the trench isolation structures 111 may be a single isolation structure encircling the central area or active area of the TVS device.

In the present illustration, the P-buried layer 108 is formed on the top of the N-buried layer 106. In other embodiments, the P-buried layer 108 can be implanted at the same depth as the N-buried layer 106 and the subsequently annealing may drive the P-type dopants to out-diffuse onto both sides of the N-buried layer, forming P-type buried layer on both sides of the N-buried layer. The exact structure of the P-type buried layer is not critical and it is only necessary that the P-buried layer 108 is formed at least above the N-buried layer.

With the P-buried layer 108 thus formed, the TVS device 400 uses an N+ sinker region 128 to connect the N-buried layer 106 to a heavily doped P+ region 126 formed at the surface of the semiconductor structure. By using the N+ sinker region 128, the emitter-base junction breakdown is brought up to the surface of the semiconductor structure at junction between the N+ sinker and the P+ region 126. The emitter-base breakdown is thus better controlled by bringing the breakdown to the surface of the semiconductor structure. In the present embodiment, the N+ sinker region 128 is formed adjacent and abut the trench isolation structure 111. In other embodiments, the N+ sinker region 128 may be formed adjacent but does not have to abut the trench isolation structure 111. Furthermore, in the present embodiment, the heavily doped P+ region 126 is formed above the N+ sinker region 128. In other embodiments, the heavily doped P+ region 126 only needs to overlap the N+ sinker region 128 or be in electrical and physical contact with the N+ sinker region 128.

In the TVS device 400 of FIG. 6, the breakdown voltage is determined by the doping concentration of the N+ sinker region 128 and the P+ region 126. The doping density of the N-buried layer 106 and the P-buried layer 108 determines the injection efficiency. Meanwhile, the blocking voltage is determined by the collector-base junction—that is, the breakdown voltage of the N+ region 116 and the P-body1 region 124.

Figure 7:
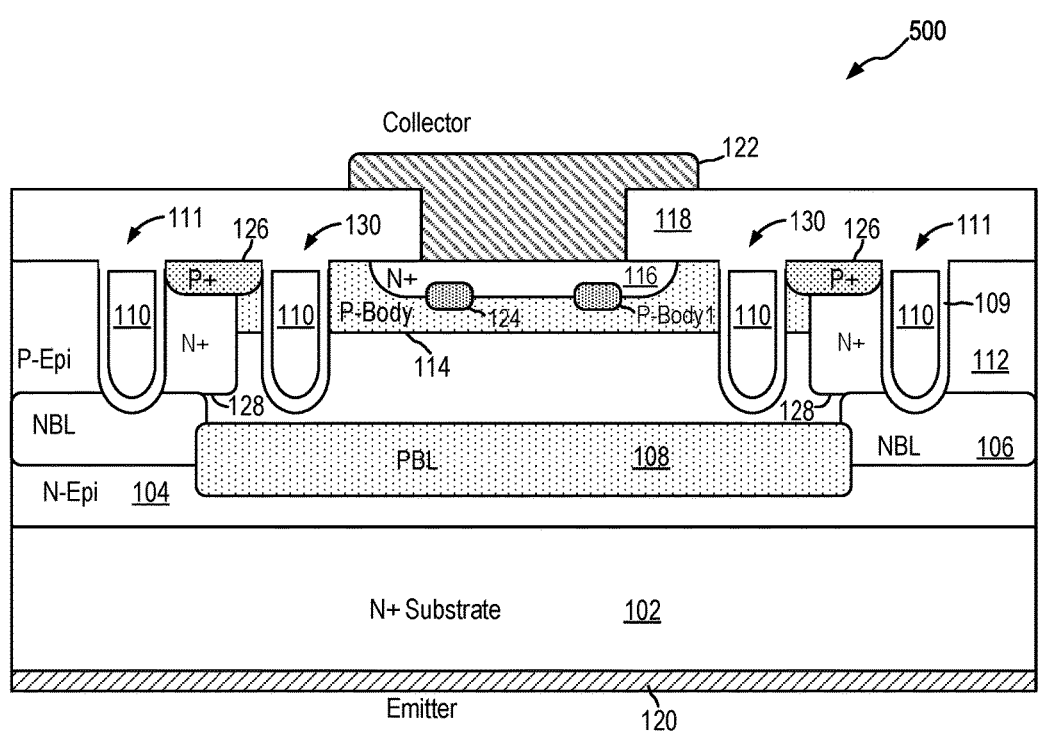
FIG. 7 is a cross-sectional view of a TVS device formed using an NPN bipolar transistor structure according to a fifth embodiment of the present invention.

FIG. 7 is a cross-sectional view of a TVS device formed using an NPN bipolar transistor structure according to a fifth embodiment of the present invention. Referring to FIG. 7, a TVS device 500 is constructed in a similar manner as the TVS device 400 of FIG. 6 except for the formation of the N-type buried layer and P-type buried layer and the use of additional trench isolation. In the TVS device 500, the P-buried layer 108 is formed in a central portion or an active area of the TVS device between the N-buried layer 106. The P-buried layer 108 is also formed at a deeper junction depth than the N-buried layer 106. The TVS device 500 includes N+sinker regions 128 to connect the N-buried layer 106 to a heavily doped P+ region 126 formed at the surface of the semiconductor structure. By using the N+ sinker region 128, the emitter-base junction breakdown is brought up to the surface of the semiconductor structure at junction between the N+ sinker 128 and the P+ region 126.

In TVS device 500, the N+ sinker regions 128 are formed on the perimeter of the TVS device and additional trench isolation structures 130 are used to isolate the N+sinker regions 128 from the collector region of the TVS device, as defined by the N+ region 116. The trench isolation structures 130 are used to stop lateral injection from the N+ sinker/P+ junction into the collect-base region of the TVS device. The trench isolation structures 130 are poly filled trenches in the present embodiment. In other embodiments, the trench isolation structures 130 can be oxide filled trenches. In yet another embodiment, instead of using trench isolation, the lateral isolation can be accomplished by increasing the distance between the N+ sinker 128 and the N+ collector region 116. Furthermore, the trench isolation structures 130 can be formed as a single trench isolation structure encircling the central portion or active area of the TVS device. Similarly, the trench isolation structures 111 may be formed as a single trench isolation structure encircling the central portion or active area of the TVS device, including the N+ sinker 128 and the P+ region 126.

In the TVS device 500 of FIG. 7, the breakdown voltage is determined by the doping concentration of the N+ sinker region 128 and the P+ region 126. The doping density of the N-buried layer 106 and the P-buried layer 108 determines the injection efficiency. Meanwhile, the blocking voltage is determined by the collector-base junction—that is, the breakdown voltage of the N+ region 116 and the P-body1 region 124.

In operation, when the TVS device 500 receives a high surge at the collector terminal, the breakdown occurs at the N+ collector to the P-body junction. Alternately, when the TVS device 500 receives a high surge at the emitter terminal, the breakdown occurs at the N+ sinker to the P+ junction first and then the breakdown occurs at the P-buried layer to the N+ substrate.

In an alternate embodiment of the embodiment shown in FIG. 7, the buried layers can be formed by forming the N-buried layer across the entire active area region and forming the P-buried layer above the N-buried layer, as in the TVS device 400 of FIG. 6.

In embodiments of the present invention, the breakdown voltage of the TVS device can be tuned by adjusting the doping levels of the doped base regions-the P-body region, or the P-body1 region (if any), or the P-buried layer. By decreasing the doping levels of the base doping regions (P-body region, or the P-body1 region, or the P-buried layer), the breakdown voltage of the TVS device increases. In some embodiments, the thickness of the P-type epitaxial layer can be increased to increase the breakdown voltage.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A transient voltage suppressing (TVS) device, comprising:
   a semiconductor substrate of a first conductivity type, the substrate being heavily doped;
   a first epitaxial layer of the first conductivity type formed on the substrate, the first epitaxial layer having a first thickness;
   a first buried layer of the first conductivity type and a second buried layer of a second conductivity type formed on the first epitaxial layer, the second conductivity type opposite the first conductivity type, the second buried layer being formed in a central portion of the TVS device, wherein the first buried layer is formed around an outer perimeter adjacent and surrounding the second buried layer;
   a second epitaxial layer of the second conductivity type formed on the first epitaxial layer and the first and second buried layers;
   a first body region of the second conductivity type formed at a first surface in the second epitaxial layer; and
   a first heavily doped region of the first conductivity type formed in the first body region at the first surface of the second epitaxial layer,
   wherein the semiconductor substrate forms an emitter, the first heavily doped region forms a collector, and the second buried layer, the second epitaxial layer and the first body region form the base of the TVS device; and
   wherein the base of the TVS device comprises a first doped base region formed by the second buried layer and a second doped base region formed by the first body region, the first and second doped base regions being more heavily doped than the second epitaxial layer, the first doped base region and the semiconductor substrate forming an emitter-base junction being a first avalanche junction and the second doped base region and the first heavily doped region forming a collector-base junction being a second avalanche junction.

2. The TVS device of claim 1, wherein the second buried layer has a doping level selected to optimize a breakdown voltage of the TVS device and the first body region has a doping level selected to optimize a blocking voltage of the TVS device, the second buried layer and the first body region having the same or different doping levels.

3. The TVS device of claim 1, further comprising:
   a first trench isolation structure formed encircling an active area of the TVS device to provide isolation of the TVS device.

4. The TVS device of claim 3, wherein the first trench isolation structure comprises a trench formed extending to the first buried layer, the trench being lined with an oxide layer and filled with a polysilicon layer.

5. The TVS device of claim 3, wherein the first trench isolation structure comprises a trench formed extending to the first buried layer and filled with an oxide layer.

6. The TVS device of claim 3, wherein the first buried layer extends across the active area of the TVS device encircled by the first trench isolation structure, the second buried layer being formed over the first buried layer between the first buried layer and the first body region, and wherein the TVS device further comprising:
   a sinker diffusion region of the first conductivity type formed in the active area of the TVS device adjacent the first trench isolation structure, the sinker diffusion region extending to the first buried layer and to the first surface of the second epitaxial layer;
   a second heavily doped region of the second conductivity type formed at the first surface of the second epitaxial layer and in electrical and physical contact with the sinker diffusion region; and
   a second trench isolation structure formed in the active area of the TVS device and encircling a portion of the active area of the TVS device, the second trench isolation structure being formed adjacent the sinker diffusion region, the sinker diffusion region being formed between the first trench isolation structure and the second trench isolation structure, wherein the second trench isolation structure protects the TVS device from lateral injection from the junction between the sinker diffusion region and the second heavily doped region.

7. The TVS device of claim 1, wherein the first and second buried layers are formed at the same junction depth on the first epitaxial layer.

8. The TVS device of claim 7, wherein the second buried layer includes a portion extending over the first buried layer, the portion being formed on the first buried layer between the first buried layer and the first body region.

9. The TVS device of claim 1, wherein the second buried layer is formed at a junction depth deeper in the first epitaxial layer than the junction depth of the first buried layer.

10. The TVS device of claim 1, further comprising:
a second body region of the second conductivity type formed at a junction of the first heavily doped region and the first body region, the second body region being more heavily doped than the first body region.

11. The TVS device of claim 10, wherein the second body region comprises a plurality of islands of doped regions dispersed at the junction of the first heavily doped region and the first body region.

12. A transient voltage suppressing (TVS) device, comprising:
a semiconductor substrate of a first conductivity type, the substrate being heavily doped;
a first epitaxial layer of the first conductivity type formed on the substrate, the first epitaxial layer having a first thickness;
a first buried layer of the first conductivity type and a second buried layer of a second conductivity type formed on the first epitaxial layer, the second conductivity type opposite the first conductivity type, the second buried layer being formed in a central portion of the TVS device;
a second epitaxial layer of the second conductivity type formed on the first epitaxial layer and the first and second buried layers;
a first body region of the second conductivity type formed at a first surface in the second epitaxial layer;
a first heavily doped region of the first conductivity type formed in the first body region at the first surface of the second epitaxial layer; and
a first trench isolation structure formed encircling an active area of the TVS device to provide isolation of the TVS device,
wherein the semiconductor substrate forms an emitter, the first heavily doped region forms a collector, and the second buried layer, the second epitaxial layer and the first body region form the base of the TVS device;
wherein the base of the TVS device comprises a first doped base region formed by the second buried layer and a second doped base region formed by the first body region, the first and second doped base regions being more heavily doped than the second epitaxial layer, the first doped base region and the semiconductor substrate forming an emitter-base junction being a first avalanche junction and the second doped base region and the first heavily doped region forming a collector-base junction being a second avalanche junction; and
wherein the first buried layer is formed around an outer perimeter surrounding the second buried layer, the first trench isolation structure extending into the first buried layer, and the second buried layer is formed at a junction depth deeper in the first epitaxial layer than the junction depth of the first buried layer.

13. The TVS device of claim 12, further comprising:
a sinker diffusion region of the first conductivity type formed in the active area of the TVS device adjacent the first trench isolation structure, the sinker diffusion extending to the first buried layer and to the first surface of the second epitaxial layer; and
a second heavily doped region of the second conductivity type formed at the first surface of the second epitaxial layer and in electrical and physical contact with the sinker diffusion region.

14. The TVS device of claim 13, further comprising:
a second trench isolation structure formed in the active area of the TVS device and encircling a portion of the active area of the TVS device, the second trench isolation structure being formed adjacent the sinker diffusion region, the sinker diffusion region being formed between the first trench isolation structure and the second trench isolation structure,
wherein the second trench isolation structure protects the TVS device from lateral injection from the junction between the sinker diffusion region and the second heavily doped region.

15. The TVS device of claim 14, wherein the second trench isolation structure comprises a trench formed extending to the same depth as the first trench isolation structure, the trench being lined with an oxide layer and filled with a polysilicon layer.

16. The TVS device of claim 14, wherein the second trench isolation structure comprises a trench formed extending to the same depth as the first trench isolation structure and filled with an oxide layer.

17. The TVS device of claim 13, where in the sinker diffusion region and the second heavily doped region are formed a first distance away from the first heavily doped region, the first distance being selected to protect the TVS device from lateral injection from the junction between the sinker diffusion region and the second heavily doped region.

18. A transient voltage suppressing (TVS) device, comprising:
a semiconductor substrate of a first conductivity type, the substrate being heavily doped;
a first epitaxial layer of the first conductivity type formed on the substrate, the first epitaxial layer having a first thickness;
a first buried layer of the first conductivity type and a second buried layer of a second conductivity type formed on the first epitaxial layer, the second conductivity type opposite the first conductivity type, the second buried layer being formed in a central portion of the TVS device;
a second epitaxial layer of the second conductivity type formed on the first epitaxial layer and the first and second buried layers;
a first body region of the second conductivity type formed at a first surface in the second epitaxial layer;
a first heavily doped region of the first conductivity type formed in the first body region at the first surface of the second epitaxial layer; and
a first trench isolation structure formed encircling an active area of the TVS device to provide isolation of the TVS device,
wherein the semiconductor substrate forms an emitter, the first heavily doped region forms a collector, and the second buried layer, the second epitaxial layer and the first body region form the base of the TVS device;

wherein the base of the TVS device comprises a first doped base region formed by the second buried layer and a second doped base region formed by the first body region, the first and second doped base regions being more heavily doped than the second epitaxial layer, the first doped base region and the semiconductor substrate forming an emitter-base junction being a first avalanche junction and the second doped base region and the first heavily doped region forming a collector-base junction being a second avalanche junction; and wherein the first buried layer extends across the active area of the TVS device encircled by the first trench isolation structure, the second buried layer is formed over the first buried layer between the first buried layer and the first body region and is formed only within the active area encircled by the first trench isolation structure, and the first trench isolation structure extends into the first buried layer.

19. The TVS device of claim 18, further comprising:
a sinker diffusion region of the first conductivity type formed in the active area of the TVS device adjacent the first trench isolation structure, the sinker diffusion region extending to the first buried layer and to the first surface of the second epitaxial layer; and
a second heavily doped region of the second conductivity type formed at the first surface of the second epitaxial layer and in electrical and physical contact with the sinker diffusion region.

20. The TVS device of claim 18, further comprising:
a second body region of the second conductivity type formed at a junction of the first heavily doped region and the first body region, the second body region being more heavily doped than the first body region.

\* \* \* \* \*